(12) United States Patent
Xue et al.

(10) Patent No.: US 11,925,064 B2
(45) Date of Patent: Mar. 5, 2024

(54) MANUFACTURING METHOD OF DISPLAY SUBSTRATE AND DISPLAY DEVICE (71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Dapeng Xue, Beijing (CN); Guangcai Yuan, Beijing (CN); Xiaochun Xu, Beijing (CN); Zheng Liu, Beijing (CN); Liangliang Li, Beijing (CN); Shuilang Dong, Beijing (CN); Lizhong Wang, Beijing (CN); Niangi Yao, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 238 days.

(21) Appl. No.: 17/468,638

(22) Filed: Sep. 7, 2021

(65) Prior Publication Data
US 2022/0077264 A1    Mar. 10, 2022

(30) Foreign Application Priority Data
Sep. 8, 2020 (CN) .......................... 202010935560.1

(51) Int. Cl.
*H01L 21/02* (2006.01)
*H01L 27/32* (2006.01)
(Continued)

(52) U.S. Cl.
CPC .... *H10K 59/1213* (2023.02); *H01L 21/02565* (2013.01); *H01L 21/02631* (2013.01);
(Continued)

(58) Field of Classification Search
CPC ............... H01L 21/0272; H01L 21/465; H01L 21/02274; H01L 21/02414; H01L 29/872; H01L 29/0661; H01L 29/24; H01L 29/66969; H01L 21/02565; H01L 21/02; H01L 21/02631; H01L 27/1225;
(Continued)

(56) References Cited

U.S. PATENT DOCUMENTS

8,835,236 B2 * 9/2014 Chang ............... H01L 29/66969
257/E29.151
9,204,554 B2 * 12/2015 Sakano ............... H01L 27/1266
(Continued)

*Primary Examiner* — Nikolay K Yushin
(74) *Attorney, Agent, or Firm* — Nath, Goldberg & Meyer; Joshua B. Goldberg (57) ABSTRACT

The present disclosure provides a display substrate including: a base substrate, and a thin film transistor, an oxygen supplementing functional layer and an oxygen containing layer formed on the base substrate. The thin film transistor includes: an active layer in direct contact with the oxygen containing layer, and the active layer includes an oxide semiconductor material. The oxygen supplementing functional layer includes a metal oxide material and serves as a first electrode of the display substrate. The oxygen containing layer is between the oxygen supplementing functional layer and the base substrate.

8 Claims, 6 Drawing Sheets

(51) Int. Cl.
*H10K 59/121* (2023.01)
*H01L 27/12* (2006.01)
*H01L 29/24* (2006.01)
*H01L 29/66* (2006.01)
*H01L 29/786* (2006.01)
*H10K 59/12* (2023.01)

(52) U.S. Cl.
CPC ........ *H01L 27/1225* (2013.01); *H01L 27/127* (2013.01); *H01L 29/24* (2013.01); *H01L 29/66969* (2013.01); *H01L 29/7869* (2013.01); *H10K 59/1201* (2023.02)

(58) Field of Classification Search
CPC ... H01L 27/12; H01L 27/127; H01L 27/1248; H01L 27/124; H01L 27/1259; H01L 29/66; H01L 29/7869; H01L 29/786; H10K 59/1201; H10K 59/1213; H10K 59/121; H10K 59/12; H10K 59/131; H10K 50/81
See application file for complete search history.

(56) References Cited

U.S. PATENT DOCUMENTS

| | | | |
|---|---|---|---|
| 10,497,620 B2* | 12/2019 | Liu | H01L 27/1248 |
| 2013/0302534 A1* | 11/2013 | Sakano | G02F 1/133305 |
| | | | 427/557 |
| 2014/0225194 A1* | 8/2014 | Chang | H01L 29/66969 |
| | | | 438/151 |
| 2016/0216584 A1* | 7/2016 | Lee | H01L 29/4908 |
| 2019/0229017 A1* | 7/2019 | Liu | H01L 27/1248 |
| 2020/0091194 A1* | 3/2020 | Cheng | H01L 27/124 |

* cited by examiner

FIG. 6 forming a thin film transistor, an oxygen containing layer and an oxygen supplementing functional layer on a base substrate —S101 diffusing the oxygen ions in the oxygen containing layer into the active layer to supplement the oxygen vacancies in the active layer —S102

MANUFACTURING METHOD OF DISPLAY SUBSTRATE AND DISPLAY DEVICE

The present application claims the priority of the Chinese Patent Application No. 202010935560.1, filed on Sep. 8, 2020, the content of which is incorporated herein by reference in its entirety.

TECHNICAL FIELD

The present disclosure relates to the field of display technology, and in particular, to a display substrate and a manufacturing method thereof, and a display device.

BACKGROUND

Since an oxide thin film transistor (Oxide TFT) has advantages of being used for manufacturing a large-area high-quality thin film at an ambient temperature, compatibility with an existing production line equipment, and being provided on a flexible base substrate, and the like, due to a low process temperature, high mobility, transparency to visible light, the oxide thin film transistor is considered to be one of the most promising next-generation thin film transistors.

In practical applications, it is found out that there are many oxygen vacancies in an active layer made of an oxide semiconductor material, and the oxygen vacancies may affect the performance of the active layer, resulting in abnormal overall performance of the Oxide TFT.

SUMMARY

According to one aspect of the present disclosure, a display substrate is provided. The display substrate includes a base substrate, and a thin film transistor, an oxygen containing layer and an oxygen supplementing functional layer on the base substrate, wherein the thin film transistor includes an active layer in direct contact with the oxygen containing layer; and a material of the active layer includes an oxide semiconductor material; a material of the oxygen supplementing functional layer includes a metal oxide material, the oxygen supplementing functional layer also serves as a first electrode of the display substrate, and the first electrode is any one of a pixel electrode, a common electrode or an anode of an organic light emitting diode; and the oxygen containing layer is between the oxygen supplementing functional layer and the base substrate.

In some embodiments, the display substrate further includes a first passivation layer on a side of the oxygen supplementing functional layer distal to the base substrate.

In some embodiments, the thin film transistor further includes a gate electrode; the oxygen containing layer is between the gate electrode and the active layer and serves as a gate insulating layer; and the first electrode is on a side of the gate insulating layer distal to the base substrate.

In some embodiments, the gate electrode is between the gate insulating layer and the base substrate; or the gate electrode is on a side of the gate insulating layer distal to the base substrate.

In some embodiments, the thin film transistor further includes source and drain electrodes on a side of the active layer distal to the base substrate; and the first electrode is between the source and drain electrodes and the gate insulating layer.

In some embodiments, the thin film transistor further includes source and drain electrodes on a side of the active layer distal to the base substrate, and a second passivation layer, the first electrode is on a side of the source and drain electrodes distal to the base substrate, and the second passivation layer is between the first electrode and the source and drain electrodes; and both the second passivation layer and the gate insulating layer serve as the oxygen containing layer.

In some embodiments, the oxide semiconductor material includes indium gallium zinc oxide.

In some embodiments, the metal oxide material includes indium tungsten oxide or indium molybdenum oxide.

In some embodiments, the metal oxide material includes a conductive indium gallium zinc oxide or a conductive indium tin oxide.

In some embodiments, the display substrate further includes a second electrode on a side of the first electrode distal to the base substrate; wherein the first electrode is a pixel electrode, and the second electrode is a common electrode; or the first electrode is a common electrode, and the second electrode is a pixel electrode; or the first electrode is an anode of an organic light emitting diode, and the second electrode is a cathode of the organic light emitting diode.

According to one aspect of the present disclosure, a display device is provided. The display device includes the above display substrate and a driving circuit for driving the display substrate.

According to one aspect of the present disclosure, a method of manufacturing a display substrate is provided. The method includes: forming a thin film transistor, an oxygen containing layer and an oxygen supplementing functional layer on a base substrate, wherein forming the thin film transistor includes forming an active layer, wherein the forming the active layer includes depositing an oxide semiconductor material and performing a patterning process on the oxide semiconductor material, forming the oxygen containing layer includes depositing an oxygen containing layer material to form the oxygen containing layer before or after forming the active layer, such that the oxygen containing layer is in direct contact with the active layer; and forming the oxygen supplementing functional layer includes depositing a metal oxide material on a side of the oxygen containing layer distal to the base substrate to form a metal oxide film by a sputtering deposition process in a sputtering deposition process environment containing oxygen; and performing a patterning process on the metal oxide film to obtain a pattern of the oxygen supplementing functional layer, such that the oxygen supplementing functional layer serves as a first electrode of the display substrate, and the first electrode is any one of a pixel electrode, a common electrode or an anode of an organic light emitting diode.

In some embodiments, the method of manufacturing a display substrate further includes performing a high temperature treatment process to cause oxygen ions contained in the oxygen containing layer to be diffused into the active layer after forming the oxygen supplementing functional layer.

In some embodiments, the metal oxide material includes indium tungsten oxide or indium molybdenum oxide, and the depositing a metal oxide material on a side of the oxygen containing layer distal to the base substrate to form a metal oxide film by a sputtering deposition process in a sputtering deposition process environment containing oxygen including: depositing a metal oxide material on a side of the oxygen containing layer distal to the base substrate to form a metal oxide film by a sputtering deposition process in a sputtering deposition process environment containing oxygen in which a proportion of an oxygen partial pressure is more than or equal to 20%.

In some embodiments, the oxygen supplementing functional layer has a thickness greater than 50 nm in a direction perpendicular to the base substrate.

In some embodiments, the metal oxide material includes a conductive indium gallium zinc oxide or a conductive indium tin oxide, and the depositing a metal oxide material on a side of the oxygen containing layer distal to the base substrate to form a metal oxide film by a sputtering deposition process in a sputtering deposition process environment containing oxygen including: depositing a metal oxide material on a side of the oxygen containing layer distal to the base substrate to form a metal oxide film by a sputtering deposition process in a sputtering deposition process environment containing oxygen in which a proportion of an oxygen partial pressure is more than equal to 50%.

In some embodiments, the oxygen supplementing functional layer has a thickness more than 20 nm in the direction perpendicular to the base substrate.

In some embodiments, the forming the thin film transistor further includes forming a gate electrode such that the oxygen containing layer is between the gate electrode and the active layer, and serves as a gate insulating layer and the oxygen containing layer is formed between forming the gate electrode and forming the active layer, and the forming the thin film transistor further includes: forming source and drain electrodes on a side of the active layer distal to the base substrate; and the oxygen supplementing functional layer is formed on the gate insulating layer.

In some embodiments, the forming the thin film transistor further includes: forming a gate electrode, such that the oxygen containing layer is between the gate electrode and the active layer, and serves as a gate insulating layer, and the oxygen containing layer is formed between forming the gate electrode and forming the active layer, and the forming the thin film transistor further includes: forming source and drain electrodes on a side of the active layer distal to the base substrate; the method further includes: forming a second passivation layer on a side of the source and drain electrodes distal to the base substrate, and both the gate insulating layer and the second passivation layer serve as the oxygen containing layer, and the oxygen supplementing functional layer is formed on the second passivation layer.

In some embodiments, the performing a high temperature treatment process to cause oxygen ions contained in the oxygen containing layer to be diffused into the active layer includes: forming a first passivation layer on a side of the oxygen supplementing functional layer distal to the base substrate by a deposition process in a deposition process environment, such that the oxygen ions in the oxygen containing layer are diffused into the active layer.

DETAILED DESCRIPTION

In order to make those skilled in the art better understand the technical solution of the present disclosure, a display substrate and a method for manufacturing thereof, and a display device in the present disclosure are described in detail below with reference to the accompanying drawings.

In the related art, in order to effectively reduce oxygen vacancies in an active layer of an oxide thin film transistor during a procedure of manufacturing a display substrate including an oxide thin film transistor, a process step of forming an oxygen supplementing functional layer is added in the existing manufacturing procedure of the display substrate. Specifically, after a process step of forming the active layer is finished, an additional process step of forming an oxygen supplementing functional layer is added. The oxygen supplementing functional layer is made of an oxide material which may be deposited to form a film by a sputtering process in an oxen containing environment. In this case, during manufacturing the oxygen supplementing functional layer, oxygen in the oxygen containing environment may supplement the oxygen vacancies in the active layer, so that the oxygen vacancies in the active layer can be effectively reduced.

In the related art, although the oxygen vacancies in the active layer can be reduced to a certain extent, an additional sputtering process is added in the procedure of manufacturing the display substrate due to the addition of the process step of forming the oxygen supplementing functional layer, so that the process steps are complicated, and the energy consumption is increased.

Figure 1A:
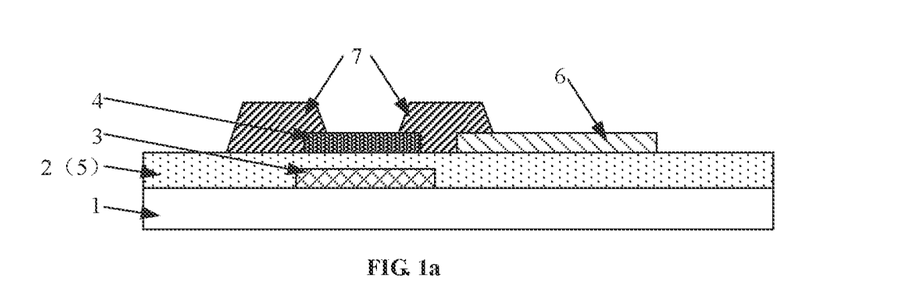
FIG. 1a is a schematic diagram illustrating a structure of a display substrate according to an embodiment of the present disclosure.
Figure 1B:
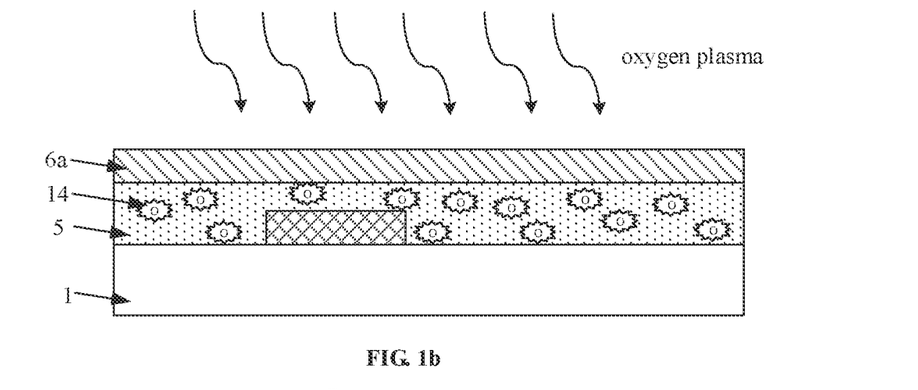
FIG. 1b is a schematic diagram illustrating implanting oxygen ions into an oxygen containing layer according to an embodiment of the present disclosure.
Figure 2:
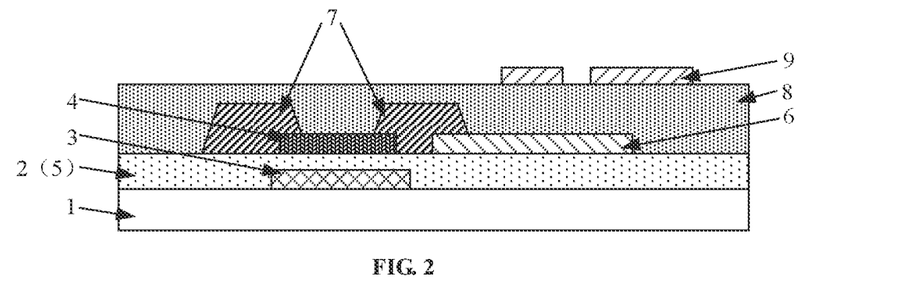
FIG. 2 is a schematic diagram illustrating a structure of a display substrate according to an embodiment of the present disclosure.

FIG. 1a is a schematic diagram illustrating a structure of a display substrate according to an embodiment of the present disclosure, and FIG. 2 is a schematic diagram illustrating a structure of a display substrate according to an embodiment of the present disclosure. As shown in FIGS. 1a and 1b, the display substrate includes: a base substrate 1, and a thin film transistor, an oxygen containing layer 5 and an oxygen supplementing functional layer formed on the base substrate 1.

The thin film transistor includes: an active layer 4 in direct contact with the oxygen containing layer 5. The active layer 4 may be made of an oxide semiconductor material, Optionally, the oxide semiconductor material may include a metal oxide semiconductor material, such as indium gallium zinc oxide (IGZO).

The oxygen supplementing functional layer also serves as a first electrode 6 of the display substrate. The first electrode 6 may be a pixel electrode, a common electrode, or an anode of an organic light emitting diode (OLED). The first electrode 6 may be made of: a metal oxide material. The oxygen supplementing functional layer may be used as the first electrode 6, which means that the first electrode 6 is the oxygen supplementing functional layer. That is, the first electrode in the embodiment of the present disclosure is also used as the oxygen supplementing functional layer.

The oxygen containing layer 5 may be between the first electrode 6 (i.e., the oxygen supplementing functional layer) and the base substrate 1, and is configured to contain oxygen ions implanted during the formation of the oxygen supplementing functional layer and to release the oxygen ions to supplement oxygen vacancies in the active layer 4.

In the embodiment of the present disclosure, the first electrode 6 serves two functions. One of the two functions is that the first electrode 6 serves as a pixel electrode, a common electrode or an anode of an organic light emitting diode. The other of the two functions is that the first electrode 6 serves as an oxygen supplementing functional layer which is in coordination with the oxygen containing layer 5 to supplement the oxygen vacancies in the active layer 4, The operation principle of the first electrode 6 as the oxygen supplementing functional layer in the embodiment of the present disclosure will be described in detail below.

In some embodiments, the first electrode 6 has a pattern formed by patterning a metal oxide film made of a metal oxide material, and the metal oxide film is formed in a sputtering deposition process environment in Which a proportion of an oxygen partial pressure (i.e., a proportion of an oxygen partial pressure in a process chamber to a total gas pressure in the process chamber) is greater than or equal to 20%.

Referring to FIG. 1b, in the embodiment of the present disclosure, the oxygen containing layer 5 is formed before the first electrode 6 is formed. When the first electrode 6 is formed, the metal oxide thin film for forming the first electrode 6 is formed under a sputtering deposition process environment in which the proportion of the oxygen partial pressure is more than or equal to 20% (≥20%), When the metal oxide film is deposited under a high oxygen environment (the proportion of the oxygen partial pressure is more than or equal to 20%), oxygen is excited into oxygen plasma. A large amount of oxygen ions 14 are implanted into the underlying oxygen containing layer 5, i.e., the oxygen containing layer 5 has a large concentration of oxygen ions 14 therein.

During a subsequent process (the patterned active layer 4 has been formed), the oxygen containing layer 5 may be caused to release the oxygen ions 14 by a high temperature process (typically greater than 220° C., for example, when a first passivation layer is subsequently formed by plasma chemical vapor deposition), such that the oxygen ions 14 diffuse into the active layer 4 to supplement the oxygen vacancies in the active layer 4.

Based on the above, the oxygen vacancies in the active layer 4 can be supplemented by the technical scheme of the present disclosure, which is beneficial to improving the performance of the active layer 4 and thus the overall performance of the TFT. In addition, in the embodiment of the present disclosure, the pixel electrode, the common electrode, or the anode of the OLED (i.e., the first electrode 6) may be reused as the oxygen supplementing functional layer, so that an additional oxygen supplementing structure in the display substrate and an additional corresponding forming process are not required, which can effectively ensure a simple structure of the display substrate and a simple manufacturing procedure.

The metal oxide film made of the metal oxide material in the high oxygen sputtering deposition process environment has certain conductivity (the conductivity is related to the metal oxide material, the proportion of the oxygen partial pressure in the sputtering deposition process environment, and the like), and can serve as an electrode. However, for some high performance products (i.e., a pixel electrode/a common electrode/an anode of an OLED requiring higher conductivity), the conductivity of the metal oxide film formed in the high oxygen sputtering deposition process environment cannot meet the requirements of the high performance products. Therefore, in practical application, the metal oxide material forming the first electrode 6 may be subjected to a conductive treatment after the oxygen supplementing process is completed according to actual requirements, so as to improve the conductivity of the first electrode 6.

With continued reference to FIG. 1a, the thin film transistor further includes: a gate electrode 3. The oxygen containing layer 5 is between the gate electrode 3 and the active layer 4 and serves as a gate insulating layer. The first electrode 6 is on a side of the gate insulating layer 2 distal to the base substrate 1. In this case, the gate insulating layer 2 may serve as the oxygen containing layer 5. That is, the gate insulating layer 2 is reused as the oxygen containing layer 5, so that there is no need to additionally provide an oxygen containing layer 5 in the display substrate and a corresponding forming process, which is an optional implementation scheme in the embodiment of the present disclosure and can effectively ensure the simple structure of the display substrate and the simple manufacturing procedure.

In some embodiments, the thin film transistor further includes: source and drain electrodes 7 (including a source electrode and a drain electrode) on a side of the active layer 4 distal to the base substrate 1, and the first electrode 6 is between the source and drain electrodes 7 and the gate insulating layer 2.

FIG. 2 is a schematic diagram illustrating a structure of a display substrate according to an embodiment of the present disclosure. As shown in FIG. 2, in some embodiments, the display substrate is an array substrate in a liquid crystal display device. The display substrate includes not only the thin film transistor and the first electrode 6 but also a second electrode 9. The second electrode 9 is on a side of the first electrode 6 distal to the base substrate 1, and a first passivation layer 8 is formed between the first electrode 6 and the second electrode 9. One of the first electrode 6 and the second electrode 9 is a pixel electrode, and the other is a common electrode.

In some embodiments, a plasma enhanced chemical vapor deposition (PECVD) process is often adopted to form the first passivation layer 8. The PECVD process is a high temperature process, so that the oxygen ions in the oxygen containing layer 5 can be released during the formation of the material film of the first passification layer 8, and thus an additional high temperature process is not required to release the oxygen ions in the oxygen containing layer 5, thereby ensuring the simple manufacturing procedure.

Figure 3:
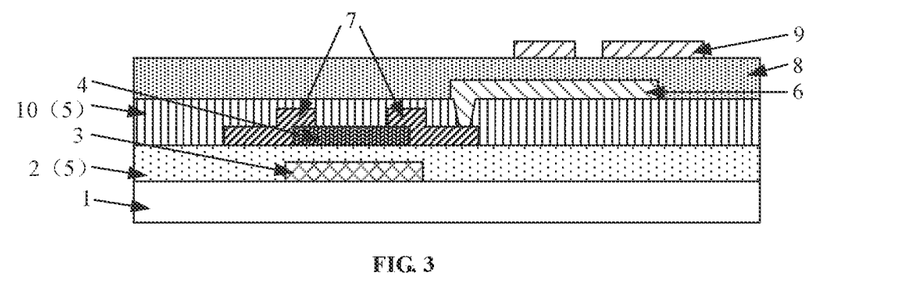
FIG. 3 is a schematic diagram illustrating a structure of a display substrate according to an embodiment of the present disclosure.

FIG. 3 is a schematic diagram illustrating a structure of a further display substrate according to an embodiment of the present disclosure. As shown in FIG. 3, unlike the structure shown in FIG. 2, the first electrode 6 in FIG. 3 is on a side of the source and drain electrodes 7 distal to the base substrate 1, and a second passivation layer 10 is formed between the first electrode 6 and the source and drain electrodes 7. In this case, both the second passivation layer 10 and the gate insulating layer 2, which are between the first electrode 6 and the base substrate 1, may serve as the oxygen containing layer 5.

It should be noted that, in the cases shown in FIGS. 2 and 3, the thin film transistor is a bottom-type gate thin film transistor, the first electrode 6 is a pixel electrode (i.e., the first electrode 6 is electrically coupled to the drain electrode), and the second electrode 9 is a common electrode, which is only exemplary and does not limit the technical solution of the present disclosure, in the embodiment of the present disclosure, any technical solutions for providing the oxygen containing layer 5 and reusing the common electrode/pixel electrode as the oxygen supplementing functional layer should be in the protection scope of the present disclosure.

Figure 4:
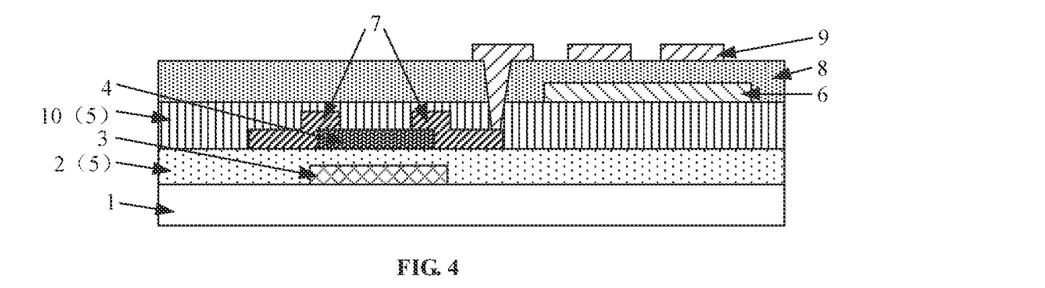
FIG. 4 is a schematic diagram illustrating a structure of a display substrate according to an embodiment of the present disclosure.

FIG. 4 is a schematic diagram illustrating a structure of a still further display substrate according to an embodiment of the present disclosure. As shown in FIG. 4, unlike the structures shown in FIGS. 2 and 3, the first electrode 6 serves as a common electrode, the second electrode 9 serves as a pixel electrode, and the second electrode 9 is electrically coupled to the drain electrode in the structure shown in FIG. 4. Both the second passivation layer 10 and the gate insulating layer 2 between the first electrode 6 and the base substrate 1 may serve as the oxygen containing layer 5.

Figure 5:
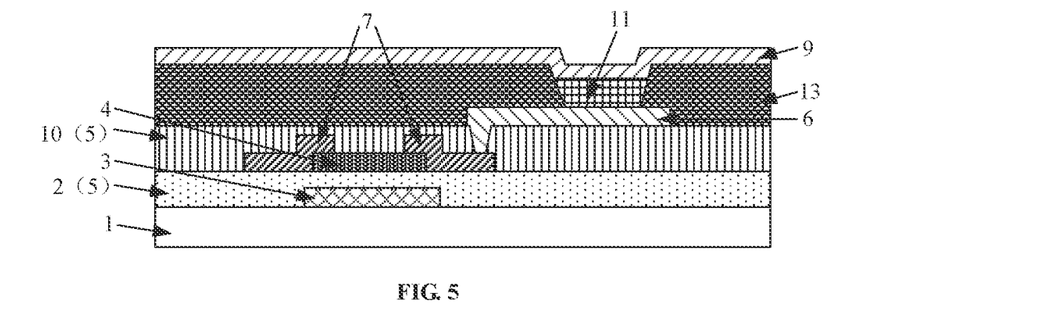
FIG. 5 is a schematic diagram illustrating a structure of a display substrate according to an embodiment of the present disclosure.

FIG. 5 is a schematic diagram illustrating a structure of a still further display substrate according to an embodiment of the present disclosure. As shown in FIG. 5, the display substrate shown in FIG. 5 is an OLED display substrate, unlike the display substrates shown in FIGS. 2 to 4 which are array substrates in a liquid crystal display device. The first electrode 6 serves as an anode of the OLED, the second electrode 9 serves as a cathode of the OLED, and a pixel defining layer 13 is formed between the first electrode 6 and the second electrode 9. A pixel accommodating aperture is formed in the pixel defining layer 13, and an organic functional layer 11 is formed in the pixel accommodating aperture. The organic functional layer 11 includes at least an organic light emitting layer, and may optionally include a hole blocking layer, an electron blocking layer, a hole transport layer, an electron transport layer, and the like.

In general, the pixel defining layer 13, the organic functional layer 11, and the second electrode 9 are sequentially formed after the anode is formed. The pixel defining layer 13 is generally made of an organic material. In order to prevent impurities such as hydrogen ions and water vapor in the organic material from diffusing into the underlying film layers and reaching the active layer 4, after the first electrode 6 is formed, the display substrate may be directly subjected to a high temperature process to allow the oxygen containing layer 5 (i.e., the gate insulating layer 2 and the second passivation layer 10) to release oxygen ions to supplement the oxygen vacancies in the active layer 4, and then the pixel defining layer 13 may be formed.

Figure 6:
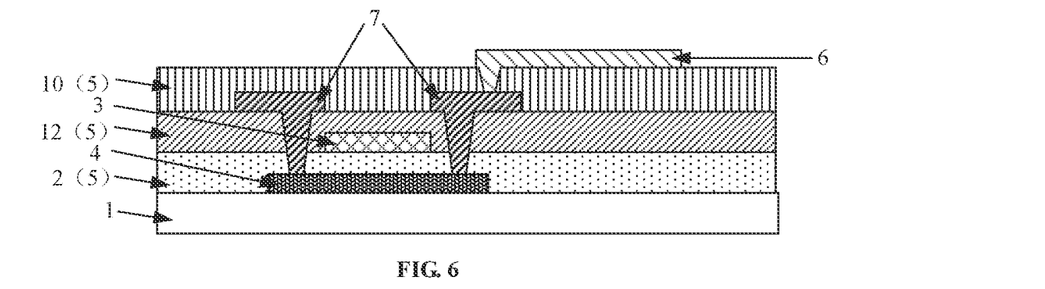
FIG. 6 is a schematic diagram illustrating a structure of a display substrate according to an embodiment of the present disclosure.

FIG. 6 is a schematic diagram illustrating a structure of a still further display substrate according to an embodiment of the present disclosure. As shown FIG. 6, unlike the structures shown in FIGS. 1 to 5, the thin film transistor in FIG. 6 is a top-gate type thin film transistor, that is, the gate electrode 3 is on a side of the active layer 4 distal to the base substrate 1, the source and drain electrodes 7 is on a side of the gate electrode 3 distal to the base substrate 1, an interlayer dielectric layer 12 is provided between the source and drain electrodes 7 and the gate electrode 3, and a second passivation layer 10 is provided between the first electrode 6 and the source and drain electrodes 7. In this case, the gate insulating layer 2, the second passivation layer 10 and the interlayer dielectric layer 12 between the first electrode 6 and the base substrate 1 may serve as the oxygen containing layer 5. That is, the layers between the first electrode 6 and the base substrate 1 capable of containing and releasing oxygen ions can serve as an oxygen containing layer.

In some embodiments, a metal material in the metal oxide material consisting of the first electrode 6 includes: one or more of indium gallium, zinc, tungsten, molybdenum or tin.

Further, the metal oxide material consisting of the first electrode 6 may include: indium gallium zinc oxide (IGZO), indium tungsten oxide (IWO), indium molybdenum oxide (IMO), indium tin oxide (ITC)), and these material can form corresponding films in a sputtering deposition process with a proportion of oxygen partial pressure more than or equal to 20%. That is, the metal oxide material may include indium tungsten oxide or indium molybdenum oxide, or alternatively, the metal oxide material may include a conductive indium gallium zinc oxide (i.e., the indium gallium zinc oxide is subjected to conductive treatment to become a conductor) or a conductive indium tin oxide.

In the display substrate in the embodiment of the present disclosure, the oxygen vacancies in the active layer can be supplemented, which is beneficial to improving the performance of the active layer and thus the overall performance of the TFT. In addition, in the embodiment of the present disclosure, the pixel electrode, the common electrode, or the anode of the OLED (i.e., the first electrode) may be reused as the oxygen supplementing functional layer, so that an additional oxygen supplement structure in the display substrate and an additional corresponding manufacturing process are not required to be provided, which can effectively ensure the simplification of the structure of the display substrate and the simplification of the manufacturing process.

Figure 7:
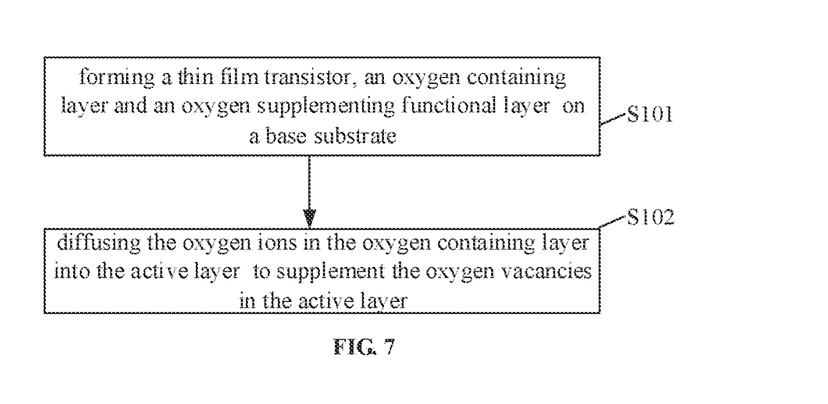
FIG. 7 is a flowchart of a method for manufacturing a display substrate according to an embodiment of the present disclosure.

FIG. 7 is a flowchart of a method for manufacturing a display substrate according to an embodiment of the present disclosure. As shown in FIG. 7, the manufacturing method may be used to manufacture the above display substrate in any of the previous embodiments, and includes the following steps.

In step S101, a thin film transistor, an oxygen containing layer and an oxygen supplementing functional layer are formed on a base substrate.

The oxygen supplementing functional layer may be reused as a first electrode. The first electrode is a pixel electrode, a common electrode or an anode of an OLED. The first electrode is on a side of the oxygen containing layer distal to the base substrate. The first electrode is the oxygen supplementing functional layer.

In some embodiments, the step of forming the thin film transistor includes forming an active layer, and forming the active layer includes: depositing an oxide semiconductor material on the base substrate and patterning the oxide semiconductor material to form the active layer, that is, the active layer is made of an oxide semi conductor material.

The step of forming the oxygen containing layer includes: depositing an oxygen containing layer material to form the oxygen containing layer before or after forming the active layer, such that the oxygen containing layer is in direct contact with the active layer and the oxygen ions in the oxygen containing layer can enter the active layer.

The step of forming the oxygen supplementing functional layer includes the following. Firstly, a metal oxide material is deposited on a side of the oxygen containing layer distal to the base substrate by a sputtering deposition process in a sputtering deposition process environment containing oxygen to form a metal oxide film. Oxygen exists in the sputtering deposition process environment, so that certain oxygen ions are implanted into the oxygen containing layer in the process of forming the metal oxide film. Then, the metal oxide film is patterned to obtain a pattern of the first electrode (i.e., the oxygen supplementing functional layer).

Further, the manufacturing method of the display substrate further includes performing a high temperature treatment process to cause oxygen ions contained in the oxygen containing layer to be diffused into the active layer after forming the oxygen supplementing functional layer, so as to supplement the oxygen vacancies in the active layer.

In some embodiments, the oxygen partial pressure in the sputtering deposition process environment in which the metal oxide film is formed has a proportion greater than or equal to 20%.

In some embodiments, the metal material in the metal oxide material consisting of the first electrode includes one or more of indium, gallium, zinc, tungsten, molybdenum and tin. The oxide semiconductor material may include indium gallium zinc oxide.

Further, the metal oxide material includes at least one of indium gallium zinc oxide, indium tungsten oxide, indium molybdenum oxide or indium tin oxide. These metal oxide materials all have a certain conductivity.

In step S102, the oxygen ions in the oxygen containing layer are diffused into the active layer so as to supplement the oxygen vacancies in the active layer.

In some embodiments, the oxygen ions in the oxygen containing layer may be diffused to the active layer by a high temperature process.

According to the manufacturing method of the display substrate in the embodiment of the present disclosure, a large amount of oxygen ions are implanted into the oxygen containing layer in the process of manufacturing the first electrode, and then the oxygen ions in the oxygen containing layer is released to supplement the oxygen vacancies in the active layer by a high temperature process, which is beneficial to improving the performance of the active layer and thus the overall performance of the TFT. In addition, in the embodiment of the present disclosure, the pixel electrode, the common electrode, or the anode of the OLED (i.e., the first electrode) may be reused as the oxygen supplementing functional layer, so that an additional oxygen supplement structure in the display substrate and an additional corresponding manufacturing process are not required to be provided, which can effectively ensure the simplification of the structure of the display substrate and the simplification of the manufacturing process.

Figure 8:
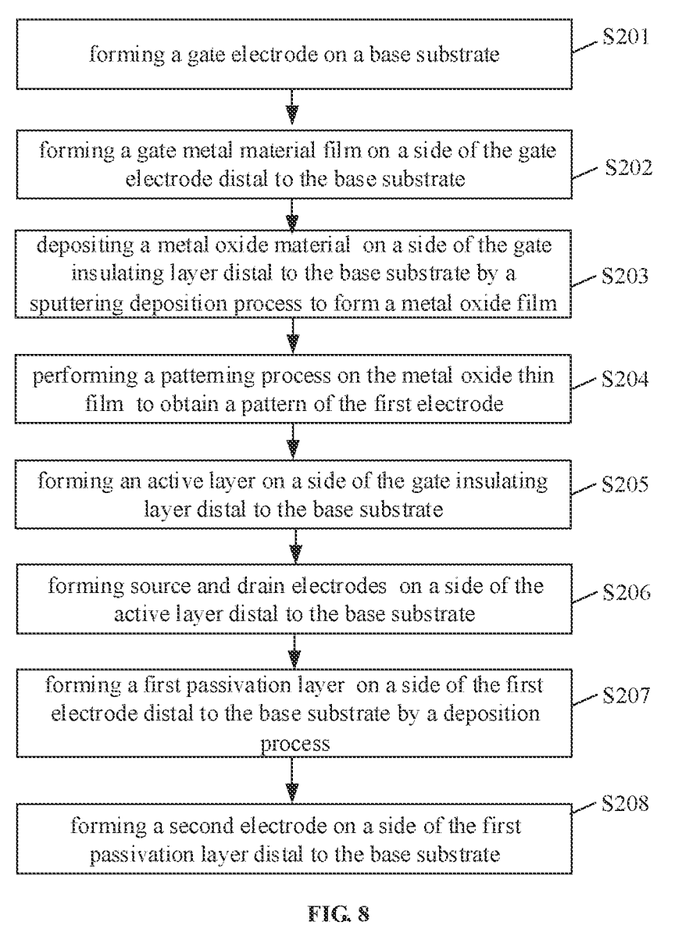
FIG. 8 is a flowchart of a method tier manufacturing a display substrate according to an embodiment of the present disclosure.

FIG. 8 is a flowchart of a method for manufacturing a still further display substrate according to an embodiment of the present disclosure. As shown in FIG. 8, the manufacturing method may be used to manufacture the display substrate shown in FIG. 2, and includes the following steps.

In step S201, a gate electrode is formed on a base substrate.

In step S201, a gate metal material film is firstly formed on a base substrate by a sputtering deposition process, and the gate metal material may include: copper, molybdenum, aluminum, and the like; and then, a patterning process is performed on the gate metal material film to obtain a gate electrode pattern.

In step S202, a gate insulating layer is formed on a side of the gate electrode distal to the base substrate.

In some embodiments, a material of the gate insulating layer includes silicon oxide and/or silicon nitride.

Taking the gate insulating layer of a double-layer stacked structure as an example, the gate insulating layer includes: a first gate insulating sub-layer and a second gate insulating sub-layer. A material of the first gate insulating sub-layer includes silicon nitride (containing no oxygen ions to prevent the gate electrode made of a metal material from being oxidized), and a material of the second gate insulating sub-layer includes silicon oxide (containing a certain amount of oxygen ions to supplement the oxygen vacancies in the active layer to a certain extent). In this case, in step S202, a silicon nitride material is firstly deposited by a sputtering deposition process to form the first gate insulating sub-layer; and a silicon oxide material is then deposited by a sputter deposition process to form the second gate insulating sub-layer.

In this embodiment, the gate insulating layer serves as an oxygen containing layer.

In step S203, a metal oxide material is deposited on a side of the gate insulating layer distal to the base substrate by a sputtering deposition process to form a metal oxide film.

In this embodiment, the metal oxide material may include IWO, IMO, or the like, a proportion of the oxygen partial pressure in the sputtering deposition process environment is greater than or equal to 20%, and a thickness of the metal oxide film is greater than 50 nm. In the process of forming the metal oxide film, a large amount of oxygen ions are implanted into the gate insulating layer, and particularly, the content of oxygen ions in the second gate insulating sub-layer is large.

Taking the metal oxide material of IWO as an example, an IWO film with a thickness of about 50 nm is formed under the sputtering deposition process environment in which the proportion of the oxygen partial pressure is 25%, a resistivity of the formed IWO film is about $6\times10^{-4}\Omega\cdot cm$, and a visible light transmittance is about 90%.

Figure 9:
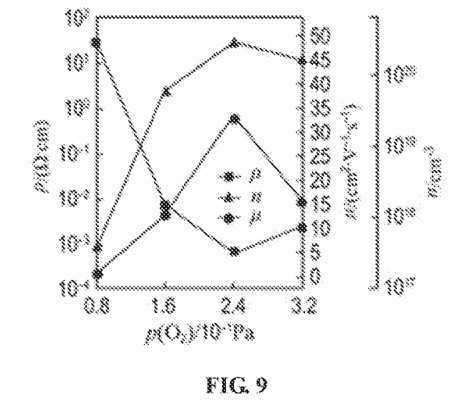
FIG. 9 is a schematic diagram illustrating IWO electrical properties varying with an oxygen partial pressure.

FIG. 9 is a schematic diagram illustrating a variation of the IWO electrical properties with an oxygen partial pressure. As shown in FIG. 9, p ($O_2$) represents the oxygen partial pressure, $\rho$ represents the resistivity, n represents carrier concentration, and $\mu$ represents carrier mobility. As can be seen from FIG. 9, under a condition of the oxygen partial pressure of $2.4\times10^{-1}$ Pa, the manufactured IWO film has an optimum resistivity of about $6.3\times10^{-4}$ Pa$\Omega\cdot$cm, the carrier mobility of about 34 $cm^2V^{-1}$ $s^{-1}$ and the carrier concentration of about $2.9\times10^{20}$ $cm^{-3}$.

It should be noted that the proportion of oxygen partial pressure in the sputtering deposition process environment can be determined according to actual film forming conditions and resistivity requirements (generally, the greater the proportion of oxygen partial pressure, the greater the resistivity of the film) and other factors. In the process of forming the metal oxide film, the oxygen content implanted into the gate insulating layer can be controlled by adjusting parameters such as a metal doping concentration in the metal oxide, a film forming temperature, a film thickness, and a output power of a sputtering equipment.

In step S204, the metal oxide film is patterned to obtain a pattern of the first electrode.

Since a film made of a material, such as IWO, IMO and the like, can be formed under a higher oxygen partial pressure, and has a smaller resistivity and better conductivity, a pattern obtained after the patterning process may be directly used as an electrode (without conductive treatment).

In step S205, an active layer is formed on a side of the gate insulating layer distal to the base substrate.

In step S205, an active material film is firstly formed by a sputtering deposition process, and optionally the active material is IGZO. Then, a patterning process is performed on the active material film to obtain a pattern of an active layer.

It should be noted that, in the process of etching the active material film, the etching thickness of the active material film needs to be accurately controlled to prevent the first electrode from being erroneously etched.

In step S206, source and drain electrodes is formed on a side of the active layer distal to the base substrate.

In step S206, a source and drain metal material film is firstly formed on the base substrate by a sputtering deposition process, and the source and drain metal material may include: copper, molybdenum, aluminum, and the like. Then, a patterning process is performed on the source and drain metal material film to obtain a pattern of source and drain electrodes.

The first electrode is a pixel electrode, and the drain electrode is lap joint with the active layer and the first electrode, so that the active layer and the first electrode are electrically coupled to each other.

In step S207, a first passivation layer is formed on a side of the first electrode distal to the base substrate by a deposition process.

In step S207, since a high temperature process of a PECVD process is adopted for forming the first passivation layer, the oxygen ions in the oxygen containing layer may be released in the process of forming the material film of the first passivation layer (i.e., the oxygen ions in the oxygen containing layer can be diffused to the active layer in step S207), so that it is not necessary to additionally add a "high temperature process" to release the oxygen ions in the oxygen containing layer, and the manufacturing procedure can be simplified.

In step S208, a second electrode is formed on a side of the first passivation layer distal to the base substrate.

Firstly, a conductive material is deposited on the base substrate by a sputtering deposition process to form a conductive material thin film, and the conductive material may include a transparent conductive material, such as ITO. Then, a patterning process is performed on the conductive material film to obtain a pattern of the second electrode. The second electrode serves as a common electrode.

The display substrate shown in FIG. 2 can be manufactured by the steps S201 to S208.

Figure 10:
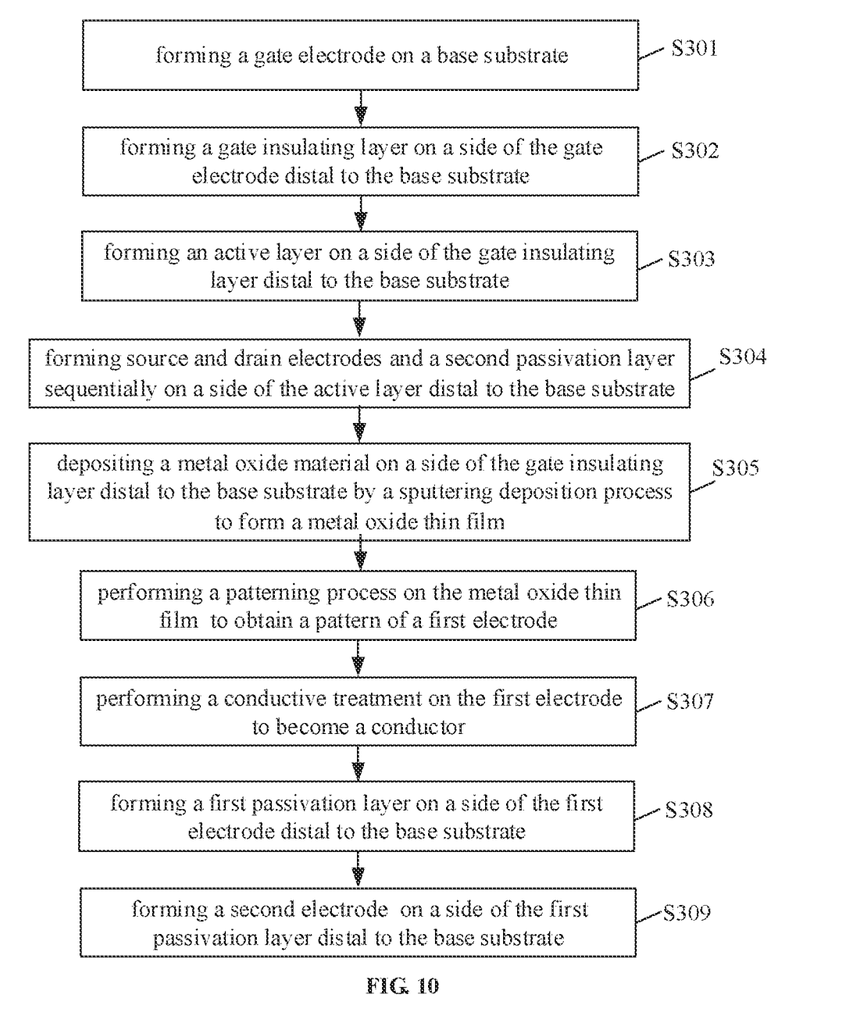
FIG. 10 is a flowchart of a method for manufacturing a display substrate according to an embodiment of the present disclosure.

FIG. 10 is a flowchart of a method for manufacturing a still further display substrate according to an embodiment of the present disclosure. As shown in FIG. 10, the manufacturing method may be used to manufacture the display substrate shown in FIG. 3, and the manufacturing method includes the following steps.

In step S301, a gate electrode is formed on a base substrate.

In step S302, a gate insulating layer is formed on a side of the gate electrode distal to the base substrate.

In step S303, an active layer is formed on a side of the gate insulating layer distal to the base substrate.

Optionally, in step S303, a material of the active layer includes IGZO.

In step S304, source and drain electrodes and a second passivation layer are sequentially formed on a side of the active layer distal to the substrate.

In step S304, firstly, a first passivation material film is formed on a side of the first electrode distal to the base substrate by a sputtering deposition process, and optionally the first passivation material includes silicon nitride and/or silicon nitride. Then, the first passivation material film is etched to form a via extending to the drain electrode.

In this embodiment, both the gate insulating layer and the second passivation layer serve as the oxygen containing layer.

In step S305, a metal oxide material is deposited on a side of the gate insulating layer distal to the base substrate by a sputtering deposition process to form a metal oxide thin film.

In this embodiment, the metal oxide material may include IGZO, ITO, or the like, and a proportion of the oxygen partial pressure in the sputtering deposition process environment is greater than or equal to 50% (e.g., the proportion of the oxygen partial pressure is 100%), and a thickness of the metal oxide thin film is greater than 200 angstroms (20 nm). In the procedure of forming the metal oxide film, a large amount of oxygen ions are implanted into the gate insulating layer and the second passivation layer.

In step S306, the metal oxide thin film is patterned to obtain a pattern of a first electrode.

The first electrode serves as a pixel electrode, and the first electrode is electrically coupled to the drain electrode through the via.

In step S307, the first electrode is subjected to a conductive treatment to become a conductor.

Considering that the resistivity of the metal oxide film made of IGZO and ITO in the sputtering deposition process environment in which the proportion of the oxygen partial pressure is 0.50% or more is relatively high and the conductivity is relatively poor, the patterned first electrode is subjected to a conductive treatment (e.g., hydrogen ions are implanted into the first electrode) to enhance the conductivity of the first electrode, so that the first electrode can serve as a pixel electrode.

In step S308, a first passivation layer is formed on a side of the first electrode distal to the base substrate.

In step S308, since the sputtering deposition process for forming the first passivation layer is a high temperature process, in the process of forming the first passivation material film, the oxygen ions in the gate insulating layer and the second passivation layer can be released (i.e., the oxygen ions in the oxygen containing layer can be diffused to the active layer in step S308), so that an additional high temperature process is not required to release the oxygen ions in the oxygen containing layer, and the manufacturing process can be simplified.

In step S309, a second electrode is formed on a side of the first passivation layer distal to the base substrate.

In some embodiments, a material of the second electrode includes ITO, and the second electrode serves as a common electrode.

The display substrate shown in FIG. 3 can be manufactured by the above steps S301 to S309.

Figure 11:
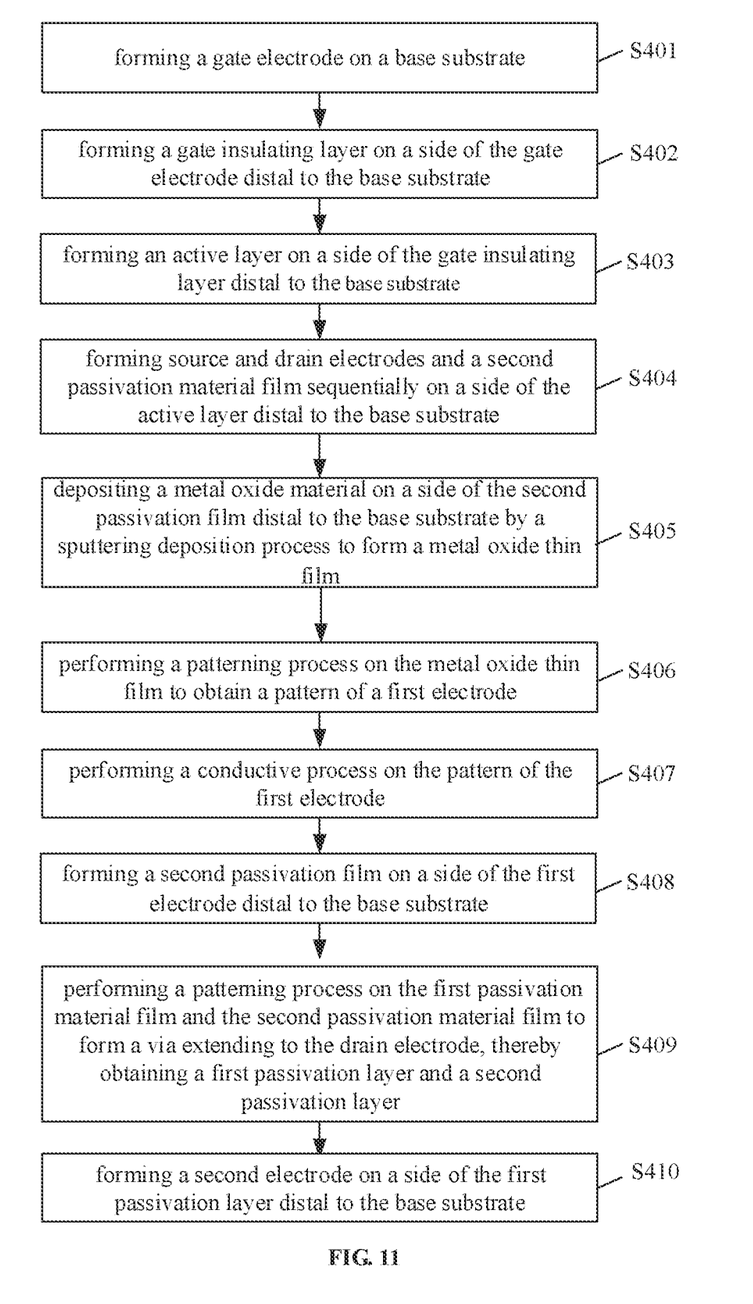
FIG. 11 is a flowchart of a method for manufacturing a display substrate according to an embodiment of the present disclosure.

FIG. 11 is a flowchart of a method for manufacturing a still further display substrate according to an embodiment of the present disclosure. As shown in FIG. 11, the manufacturing method may be used to manufacture the display substrate shown in FIG. 4, and includes the following steps.

In step S401, a gate electrode is formed on a base substrate.

In step S402, a gate insulating layer is formed on a side of the gate electrode distal to the base substrate.

In step S403, an active layer is formed on a side of the gate insulating layer distal to the base substrate.

Optionally, in step S403, a material of the active layer includes IGZO.

In step S404, source and drain electrodes and a second passivation material film are sequentially formed on a side of the active layer distal to the base substrate.

In step S404, a first passivation material film is formed on a side of the source and drain electrodes distal to the base substrate by a sputtering deposition process, and optionally the second passivation material includes silicon nitride.

In this embodiment, both the gate insulating layer and the second passivation material film serve as the oxygen containing layers.

In step S405, a metal oxide material is deposited on a side of the gate insulating layer distal to the base substrate by a sputtering deposition process to form a metal oxide thin film.

In some embodiments, the metal oxide material may include IGZO, ITO and the like, and a proportion of the oxygen partial pressure in the sputter deposition process environment is greater than or equal to 50% (e.g., 100%) and a thickness of the metal oxide thin film is greater than 20 nm. In the process of forming the metal oxide film, a large amount of oxygen ions are implanted into the gate insulating layer and the first passivation material film.

In step S406, the metal oxide thin film is patterned to obtain a pattern of a first electrode.

The first electrode serves as a common electrode.

In step S407, a conductive treatment is performed on the pattern of the first electrode.

In step S408, a second passivation film is formed on a side of the first electrode distal to the base substrate.

In step S409, a patterning process is performed on the first passivation material film and the second passivation material film to form a via extending to the drain electrode, thereby obtaining a first passivation layer and a second passivation layer.

In step S410, a second electrode is formed on a side of the first passivation layer distal to the base substrate.

In some embodiments, a material of the second electrode includes ITO, the second electrode serves as a pixel electrode, and the second electrode is electrically coupled to the drain electrode through the via.

The display substrate shown in FIG. 4 can be manufactured by the above steps S401 to S410.

Figure 12:
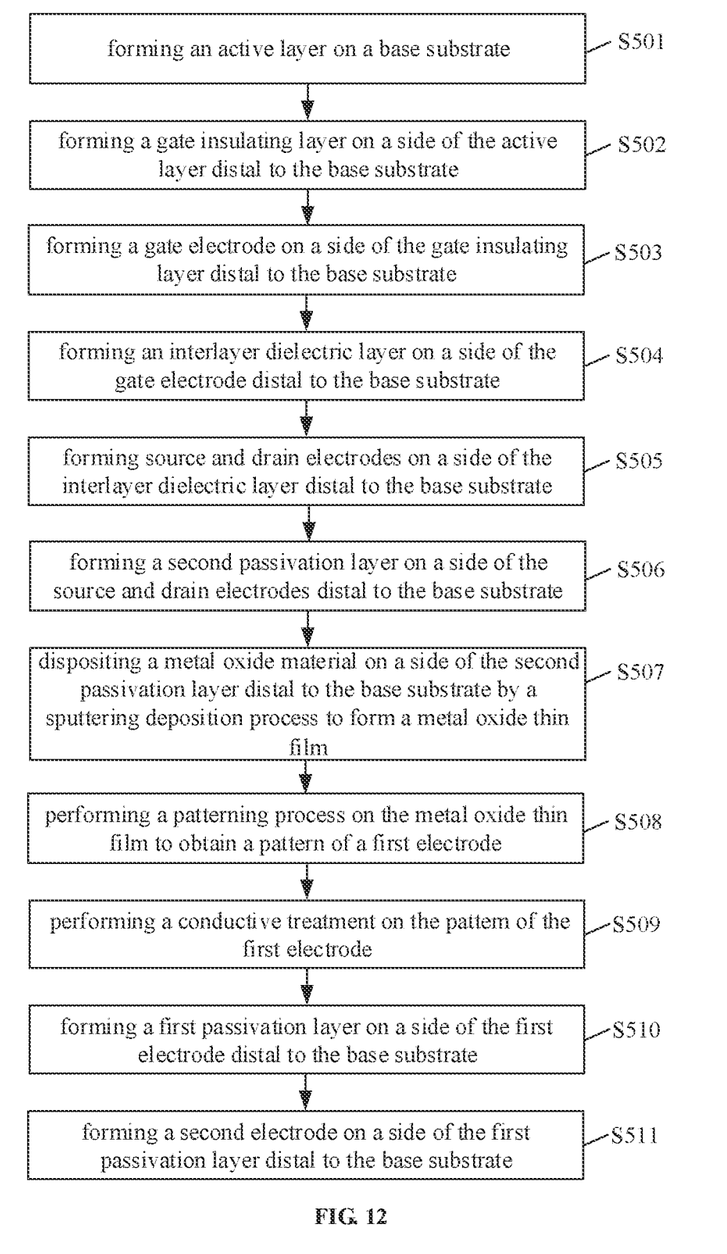
FIG. 12 is a flowchart of a method for manufacturing a display substrate according to an embodiment of the present disclosure.

FIG. 12 is a flowchart of a method for manufacturing a still further display substrate according to an embodiment of the present disclosure. As shown in FIG. 12, the manufacturing method may be used to manufacture the display substrate shown in FIG. 6, and includes the following steps.

In step S501, an active layer is formed on a base substrate.

Optionally, in step S501, a material of the active layer includes IGZO.

In step S502, a gate insulating layer is formed on a side of the active layer distal to the base substrate.

In step S503, a gate electrode is formed on a side of the gate insulating layer distal to the base substrate.

In step S504, an interlayer dielectric layer is formed on a side of the gate electrode distal to the base substrate.

In some embodiments, a material of the interlayer dielectric layer includes silicon nitride and/or silicon nitride.

In step S505, source and drain electrodes is formed on a side of the interlayer dielectric layer distal to the base substrate.

The source electrode and the drain electrode are electrically coupled to the active layer through vias extending through the interlayer dielectric layer and the gate insulating layer respectively.

In step S506, a second passivation layer is formed on a side of the source and drain electrodes distal to the base substrate.

The second passivation layer is provided with a via extending to the drain electrode.

In this embodiment, the gate insulating layer, the interlayer dielectric layer, and the second passivation film each serve as the oxygen containing layer.

In step S507, a metal oxide material is formed on a side of the second passivation layer distal to the base substrate by a sputtering deposition process to form a metal oxide thin film.

In some embodiments, the metal oxide material may include IGZO, ITO and the like, and a proportion of the oxygen partial pressure in the sputter deposition process environment is greater than or equal to 50% (e.g., 100%), and a thickness of the metal oxide film is greater than 20 nm. In the process of forming the metal oxide film, a large amount of oxygen ions are implanted into the gate insulating layer, the interlayer dielectric, and the first passivation material film.

In step S508, the metal oxide film is patterned to obtain a pattern of a first electrode.

The first electrode serves as a pixel electrode, and the first electrode is electrically coupled to the drain electrode through the via.

In step S509, the pattern of the first electrode is subjected to a conductive treatment.

In step S510, a first passivation layer is formed on a side of the first electrode distal to the base substrate.

In step S510, since the sputtering deposition process for forming the first passivation layer is a high temperature process, the oxygen ions in the gate insulating layer, the interlayer dielectric layer, and the second passivation layer can be released during the process of forming the first passivation material film (i.e., the oxygen ions in the oxygen containing layer can be diffused to the active layer in step S510), so that an additional high temperature process is not required to release the oxygen ions in the oxygen containing layer, and the manufacturing process can be simplified.

In step S511, a second electrode is formed on a side of the first passivation layer distal to the base substrate.

In some embodiments, a material of the second electrode includes ITO, and the second electrode serves as a common electrode.

The display substrate shown in FIG. 6 can be manufactured by the above steps S501 to S511.

The embodiment of the present disclosure provides a manufacturing method of a display substrate. In the process of forming the first electrode, a large amount of oxygen ions are implanted into the oxygen containing layer, and then the oxygen ions in the oxygen containing layer can be released in a high temperature process to supplement the oxygen vacancies in the active layer, which is beneficial to improving the performance of the active layer and thus the overall performance of the TFT. In addition, in the embodiment of the present disclosure, the pixel electrode, the common electrode, or the anode of the OLEO (i.e., the first electrode) may be reused as the oxygen supplementing functional layer, so that an additional oxygen supplement structure in the display substrate and an additional corresponding manufacturing process are not required to be provided, which can effectively ensure the simplification of the structure of the display substrate and the simplification of the manufacturing process.

An embodiment of the present disclosure further provides a display device, and the display device includes the above display substrate and a driving circuit for driving the display substrate. For the detailed description of the display substrate, reference may be made to the contents of the foregoing embodiments, and details are not repeated herein.

In some embodiments, the display device may be any product or component with a display function, such as a liquid crystal panel, electronic paper, an OLED panel, a mobile phone, a tablet computer, a television, a display, a notebook computer, a digital photo frame, a navigator and the like.

It should be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

What is claimed is:

1. A method of manufacturing a display substrate, comprising:
    forming a thin film transistor, an oxygen containing layer and an oxygen supplementing functional layer on a base substrate, wherein
    forming the thin film transistor comprises forming an active layer, wherein the forming the active layer comprises depositing an oxide semiconductor material and performing a patterning process on the oxide semiconductor material,
    forming the oxygen containing layer comprises depositing an oxygen containing layer material to form the oxygen containing layer before or after forming the active layer, such that the oxygen containing layer is in direct contact with the active layer; and
    forming the oxygen supplementing functional layer comprises depositing a metal oxide material on a side of the oxygen containing layer distal to the base substrate to form a metal oxide film by a sputtering deposition process in a sputtering deposition process environment containing oxygen; and performing a patterning process on the metal oxide film to obtain a pattern of the oxygen supplementing functional layer, such that the oxygen supplementing functional layer serves as a first electrode of the display substrate, and the first electrode is any one of a pixel electrode, a common electrode or an anode of an organic light emitting diode;
    the method further comprises performing a high temperature treatment process to cause oxygen ions contained in the oxygen containing layer to be diffused into the active layer after forming the oxygen supplementing functional layer.

2. The method of manufacturing a display substrate of claim 1, wherein the forming the thin film transistor further comprises forming a gate electrode such that the oxygen containing layer is between the gate electrode and the active layer, and serves as a gate insulating layer and the oxygen containing layer is formed between forming the gate electrode and forming the active layer, and
    the forming the thin film transistor further comprises:
        forming source and drain electrodes on a side of the active layer distal to the base substrate; and
    the oxygen supplementing functional layer is formed on the gate insulating layer.

3. The method of manufacturing a display substrate of claim 1, wherein the forming the thin film transistor further comprises: forming a gate electrode, such that the oxygen containing layer is between the gate electrode and the active layer, and serves as a gate insulating layer, and the oxygen containing layer is formed between forming the gate electrode and forming the active layer, and
    the forming the thin film transistor further comprises:
        forming source and drain electrodes on a side of the active layer distal to the base substrate;
    the method further comprises: forming a second passivation layer on a side of the source and drain electrodes distal to the base substrate, and both the gate insulating layer and the second passivation layer serve as the oxygen containing layer, and
    the oxygen supplementing functional layer is formed on the second passivation layer.

4. The method of manufacturing a display substrate of claim 1, wherein the performing a high temperature treatment process to cause oxygen ions contained in the oxygen containing layer to be diffused into the active layer comprises:
    forming a first passivation layer on a side of the oxygen supplementing functional layer distal to the base substrate by a deposition process in a deposition process environment, such that the oxygen ions in the oxygen containing layer are diffused into the active layer.

5. The method of manufacturing a display substrate of claim 1, wherein the metal oxide material comprises indium tungsten oxide or indium molybdenum oxide, and
    the depositing a metal oxide material on a side of the oxygen containing layer distal to the base substrate to form a metal oxide film by a sputtering deposition process in a sputtering deposition process environment containing oxygen comprising: depositing a metal oxide material on a side of the oxygen containing layer distal to the base substrate to form a metal oxide film by a sputtering deposition process in a sputtering deposition process environment containing oxygen in which a proportion of an oxygen partial pressure is more than or equal to 20%.

6. The method of manufacturing a display substrate of claim 5, wherein the oxygen supplementing functional layer has a thickness greater than 50 nm in a direction perpendicular to the base substrate.

7. The method of manufacturing a display substrate of claim 1, wherein the metal oxide material comprises a conductive indium gallium zinc oxide or a conductive indium tin oxide, and
    the depositing a metal oxide material on a side of the oxygen containing layer distal to the base substrate to form a metal oxide film by a sputtering deposition process in a sputtering deposition process environment containing oxygen comprising: depositing a metal oxide material on a side of the oxygen containing layer distal to the base substrate to form a metal oxide film by a sputtering deposition process in a sputtering deposition process environment containing oxygen in which a proportion of an oxygen partial pressure is more than or equal to 50%.

8. The method of manufacturing a display substrate of claim 7, wherein the oxygen supplementing functional layer has a thickness more than 20 nm in the direction perpendicular to the base substrate.

* * * * *

UNITED STATES PATENT AND TRADEMARK OFFICE
CERTIFICATE OF CORRECTION

PATENT NO. : 11,925,064 B2
APPLICATION NO. : 17/468638
DATED : March 5, 2024
INVENTOR(S) : Dapeng Xue et al.

It is certified that error appears in the above-identified patent and that said Letters Patent is hereby corrected as shown below:

On the Title Page

Item (72) Inventors, delete the last Inventor "Niangi YAO" and replace with "Nianqi YAO".

Signed and Sealed this
First Day of October, 2024

Katherine Kelly Vidal
*Director of the United States Patent and Trademark Office*